(12) United States Patent
Konrad et al.

(10) Patent No.: US 6,329,674 B1
(45) Date of Patent: Dec. 11, 2001

(54) COMPOSITE STRUCTURE WITH A GROWTH SUBSTRATE HAVING A DIAMOND LAYER AND A PLURALITY OF MICROELECTRONIC COMPONENTS, AND PROCESS FOR PRODUCING SUCH A COMPOSITE STRUCTURE

(75) Inventors: Brigitte Konrad, Blaustein; Herbert Guettler, Elchingen, both of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/590,007

(22) Filed: Jun. 9, 2000

Related U.S. Application Data

(62) Division of application No. 09/070,853, filed on May 1, 1998, now Pat. No. 6,110,759.

(30) Foreign Application Priority Data

May 2, 1997 (DE) .............................. 197 18 618

(51) Int. Cl.[7] ...................... H01L 31/0312; H01L 29/06; H01L 31/0336
(52) U.S. Cl. .................. 257/77; 257/14; 257/20
(58) Field of Search .................. 257/14, 20, 77

(56) References Cited

U.S. PATENT DOCUMENTS

| 5,006,914 | * | 4/1991 | Beetz, Jr. ............................ 257/77 |
| 5,082,522 | | 1/1992 | Purdes et al. . |
| 5,087,959 | | 2/1992 | Omori et al. . |
| 5,132,749 | * | 7/1992 | Nishibayashi et al. . |
| 5,204,210 | * | 4/1993 | Jansen et al. . |
| 5,500,539 | * | 3/1996 | Kadono et al. . |
| 5,523,588 | * | 6/1996 | Nishimura et al. . |
| 5,536,953 | * | 7/1996 | Dreifus et al. . |
| 5,541,423 | * | 7/1996 | Hirabayashi . |

FOREIGN PATENT DOCUMENTS

| 44 27 715 C1 | 2/1996 | (DE) . |
| 0 589 678 A2 | 3/1994 | (EP) . |
| 61-189957 | 8/1986 | (JP) . |
| 63-308324 | 12/1988 | (JP) . |
| 5-58784 | 3/1993 | (JP) . |
| 5-114729 | 5/1993 | (JP) . |
| 5-271939 | 10/1993 | (JP) . |
| 7-101798 | 4/1995 | (JP) . |
| 9-25195 | 1/1997 | (JP) . |
| WO 92/05110 | 4/1992 | (WO) . |
| WO 95/31006 | 11/1995 | (WO) . |

* cited by examiner

Primary Examiner—Stephen D. Meier
(74) Attorney, Agent, or Firm—Crowell & Moring LLP

(57) ABSTRACT

A method for producing a composite structure for microelectronic devices includes producing several microelectronic devices by means of a deposition method, preseeding a surface with growth seeds for a diamond and depositing the diamond layer from a gas phase. The diamond layer is provided with thin spots between the devices. According to the invention, the devices are laid down initially on a growth substrate directly and/or with the use of the material of the growth substrate. Following the deposition of the devices, the latter are seeded on their free surfaces for the diamond layer. The diamond layer is located on the seeded free surfaces of the devices.

13 Claims, 5 Drawing Sheets

COMPOSITE STRUCTURE WITH A GROWTH SUBSTRATE HAVING A DIAMOND LAYER AND A PLURALITY OF MICROELECTRONIC COMPONENTS, AND PROCESS FOR PRODUCING SUCH A COMPOSITE STRUCTURE

This application is a division of application Ser. No. 09/070,853, filed May 1, 1998 now U.S. Pat. No. 6,110,759.

BACKGROUND AND SUMMARY OF THE INVENTION

This application claims the priority of German patent 197 18 618.1-33, filed on May 2, 1997 in Germany, the disclosure of which is expressly incorporated by reference herein.

The invention relates to a composite structure with a growth substrate having several microelectronic devices and a diamond layer and a method for producing the composite structure.

DE 44 27 715 C1 teaches a method for producing a composite substrate in which a diamond layer is initially deposited directly on a growth substrate. A semiconductor layer is then placed on the diamond layer. Several microelectronic devices are then placed on the semiconductor layer or with the functional assistance of the semiconductor layer. The devices are to be construed as individual devices such as diodes, transistors, capacitors, inductances, etc. but also include device groups such as integrated circuits (ICs), amplifiers, storage devices, etc. As the semiconductor layer grows, the number of impurities under the devices, namely in the area of the device root, is reduced. The diamond layer has edges outside the device roots. On these edges located between the devices, and on which the diamond layer is thinner than in the vicinity of the device roots, the quality of the semiconductor layer deposited subsequently is improved above the diamond layer. Because of this improvement in semiconductor layer quality, at least in the area of the device roots, the rejection rate in production of the devices is reduced. After the epitactic production of the devices, known of itself, and their subsequent provision with contacts, the devices are then separated from each other in particular by sawing, with the growth substrate being removed by selective etching before or even after separation. Despite this improvement, the rejection rate is still high, so that these devices are still very expensive. Moreover, manufacture of a diamond layer with such edges is technologically difficult and hence is expensive as well.

The goal of the invention is to improve the composite structure so that the total costs for microelectronic devices made with the aid of the composite structure are reduced, with the best possible device quality.

This goal is achieved according to the present invention. Despite the high temperature that endangers devices when polycrystalline diamond is deposited on devices that are already finished and produced directly in known fashion, the rejection rate is reduced. Thus, the total costs of producing the devices is reduced. Moreover, the method of manufacturing the devices is known and can be accomplished at very low cost; the same applies to deposition of the diamond layer, as attention no longer needs be paid to its structure (edges). In particular, the devices can continue to be separated by sawing up the composite structure, and the diamond layer applied to most of the devices is still usable after sawing.

Other objects, advantages and novel features of the present invention will become apparent from the following detailed description of the invention when considered in conjunction with the accompanying drawings.

BRIEF DESCRIPTION OF THE DRAWINGS

The invention will be explained on the basis of the embodiments shown in the figures.

FIG. 7 shows the application of an immunization layer to a portion of the substrate surface.

DETAILED DESCRIPTION OF PREFERRED EMBODIMENTS

Figure 1:
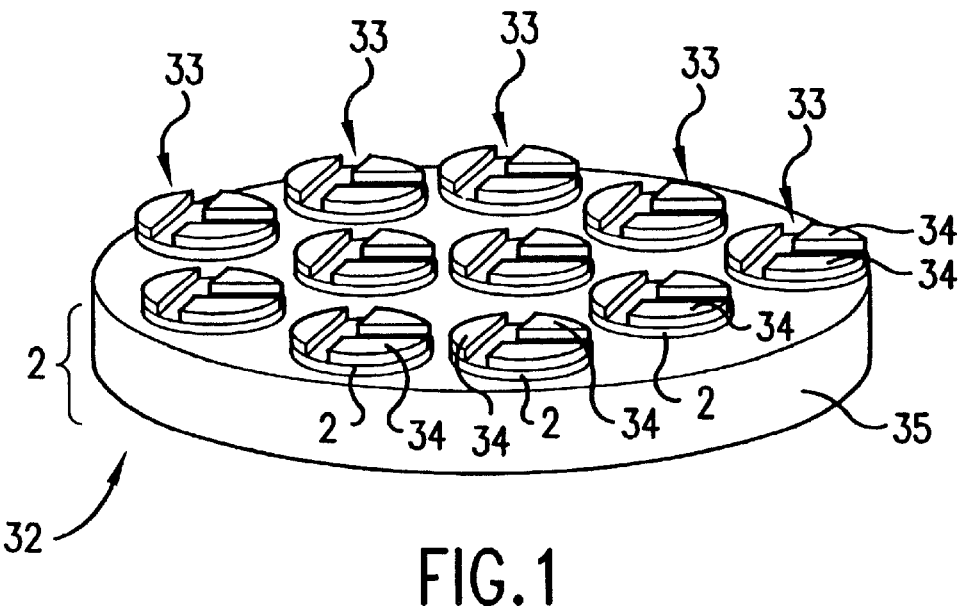
FIG. 1 shows a growth substrate with several devices and a diamond layer deposited thereon and formed as individual diamond islands.

FIG. 1 shows a composite structure 32 having several microelectronic devices 33. Devices 33 are disposed immediately on growth substrate 35. As can be seen in particular in FIG. 2, devices 33 are made by functionally using the material of growth substrate 35. "Functional use" is understood to mean that, in the area of a device 33, growth substrate 35 has for example a buried function layer 38 which in particular has n-doped or p-doped or intrinsic semiconductor layers.

Growth substrate 35 and the function layers 36, 37, and 38 of device 33 disposed directly thereon form a substrate 2 that is provided with a diamond layer on its external substrate surface 6, particularly by means of a CVD arcjet method.

Diamond layer 34 is formed of individual diamond islands spatially separated from each other, which are deposited in the polycrystalline form exclusively in the vicinity of devices 33. To achieve good adhesion on the surfaces of devices 33, the diamond islands are divided in turn into individual diamond regions that are also separated from each other. As a result, the voltage between diamond layer 34 and the surface of device 33 below it is at least reduced.

Figure 2:
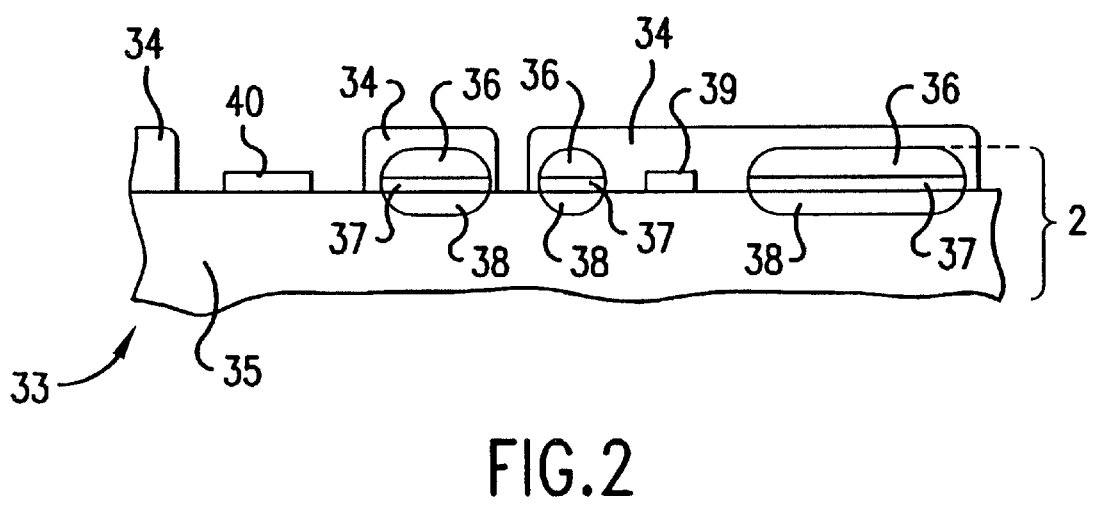
FIGS. 2 and 7 shows a portion of a section through a device with a diamond layer, made of diamond regions, located thereon.

FIG. 2 shows a portion of a section transversely to the flat side of growth substrate 35, made in particular of largely monocrystalline silicon, of a microelectronic device 33 according to the present invention. Device 33 has function layers 38 buried in growth substrate 35. Buried function layers 38 may for example be n-doped or p-doped semiconductor layers or intrinsically conducting semiconductor layers, with the doping being carried out in the usual way, particularly by diffusion and/or ion implantation.

Electrically insulating layers 37 are disposed on buried function layers 38, and consist for example of $SiO_2$ or undoped diamond and are advantageously deposited epitactically from a gas and/or liquid phase.

In the plane of the flat side of growth substrate 35, between insulation layer 37 and buried function layers 38, traces 39 are disposed, and preferably comprise aluminum.

Above an insulation layer 37, another function layer 36 is disposed, which is favorably deposited in a generally known epitactic process from a gas phase and/or a supersaturated liquid.

Individual diamond regions of diamond layer 34 are disposed above deposited function layers 36 and also at least partially above traces 39. The diamond regions of diamond layer 34 are separated spatially from each other so that even after deposition of diamond layer 34, the substrate surface 6 of substrate 2 is still open in spots. Such open areas of substrate surface 6 are provided in particular at contact points 40 at which device 33 is provided with electrical contacts.

Figure 3:
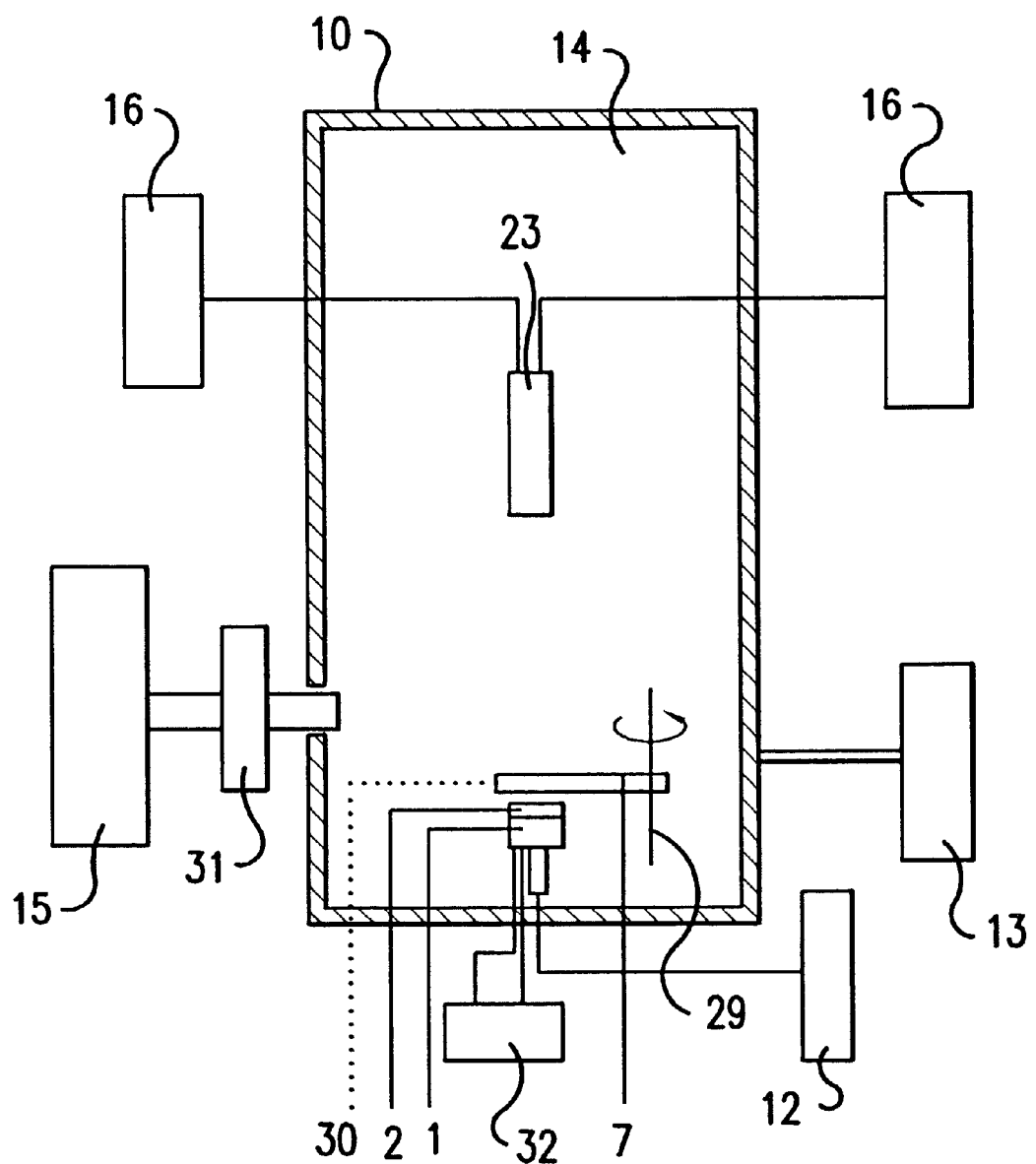
FIG. 3 is a diagram of a CVD system for depositing diamond on substrates.

FIG. 3 is a diagram of an apparatus for coating a substrate 2 with diamond layer 34. This apparatus is a supersonic DC arcjet system. The CVD system has a power range of between 1 and 5 kW.

Cylindrical reactor 10 (recipient) consists of stainless steel and has a double-wall design, making possible a water cooling system connected with the reactor by a water connection 13.

For evacuating the inside of the reactor 14, the apparatus has a pumping system 15 provided with pressure regulation 31, with three individual pumps. The pressure that can be reached is approximately $10^{-3}$ mbar. In embodiments, the pumps provided are one vane pump and two Roots pumps.

In addition, the apparatus has a gas supply system 16 with which the gases needed for a plasma (e.g., argon and/or hydrogen) and the process gases required for the diamond growth, in particular oxygen and methane, can be fed into the inside 14 of the reactor.

To determine if the temperature of substrate 2 is above 400° C., it may be advantageous if the apparatus has a heat pyrometer.

Figure 4:
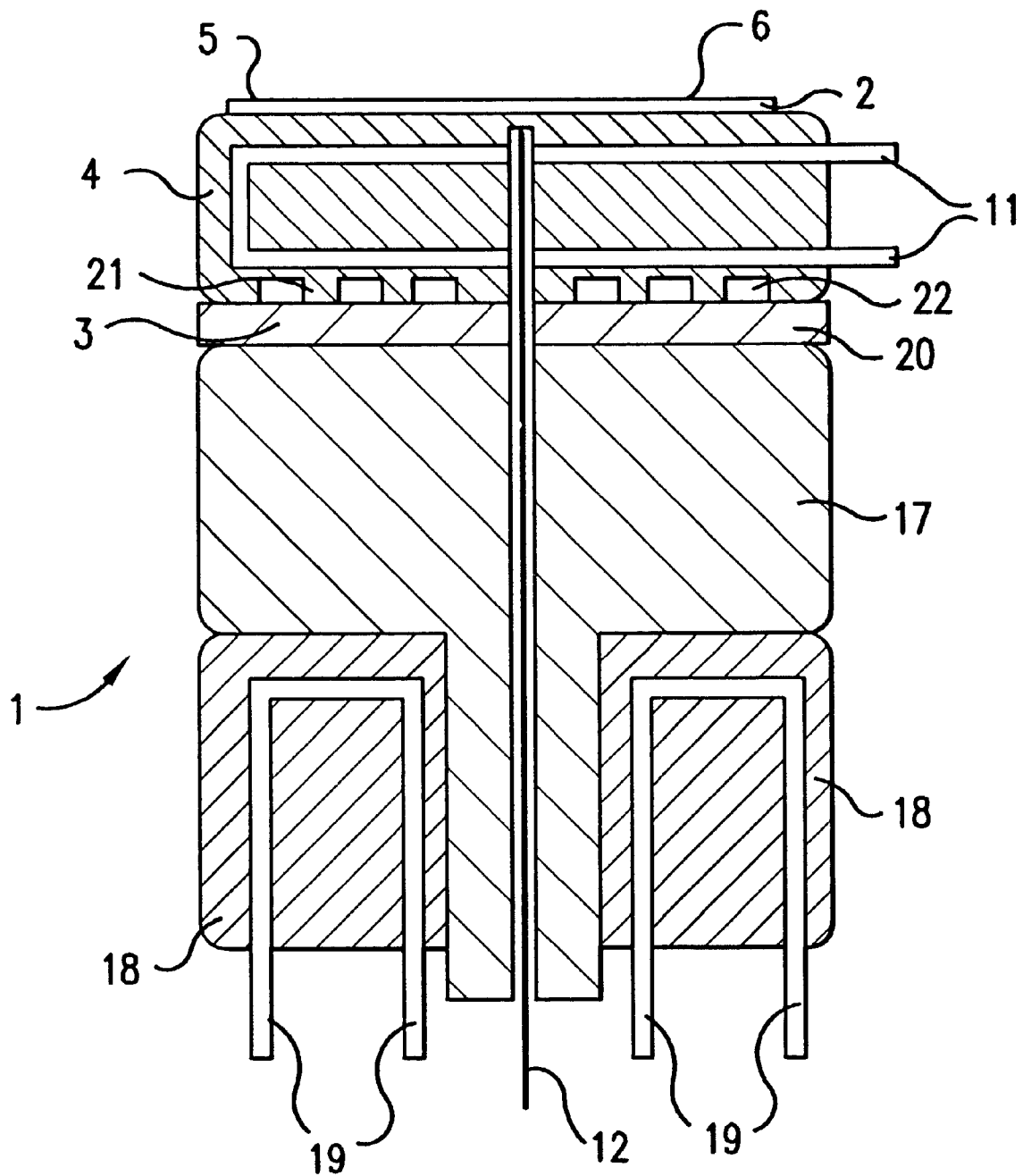
FIG. 4 is a detailed drawing of a substrate holder.

A substrate holder 1 is located inside the preferably evacuable reactor 10, the holder being provided to receive the pretreated and already seeded substrate 2 in such a way that it is flush and conducts heat well. The design of substrate holder 1 is shown in FIG. 4.

Substrate holder 1 includes a solid rotationally symmetrical block 17 that is T-shaped in cross section and is made of copper.

Figure 7:
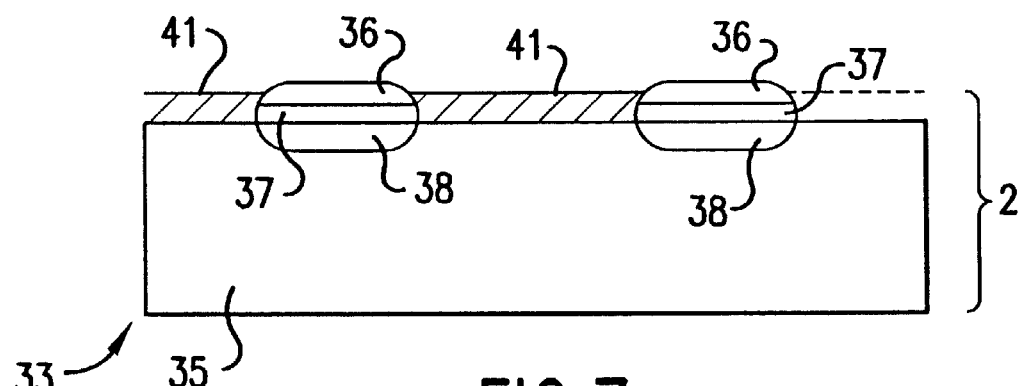

FIG. 7 shows the application of an immunization layer to a portion of the substrate surface. In the middle of the block, a thermocouple 12 is provided preferably made of chromium/aluminum (Cr/Al), for measuring the temperature of substrate 2. The free surface of the larger cross section of block 17, referred to hereinbelow as substrate side 3, faces substrate 2. A cooling body 18 made of copper is placed around block 17's thinner cross section in close contact with good heat conduction. Cooling body 18 has channels 19 in its interior through which fluid can flow for a coolant, especially water, said channels being connected with a cooling system 32.

Because of the copper, which is a good heat conductor, and the internal coolant flow, it is possible with substrate holder 1 to control the temperature of a substrate 2 placed thereon and provided in particular with a layer of conducting silver for example that is a good conductor of heat during coating with diamond at temperatures below 450° C. However, with such cooling, substrate 2 at a maximum water temperature of approximately 368 K can be kept only between approximately 400° C. and 500° C. In addition the possible temperature regulation is also limited to a range of approximately 85° C.

Instead of the conducting silver, a narrow gap can also be provided between substrate 2 and the substrate side, through which a gas is allowed to flow, with temperature control then being performed by convection. Since this gap is usually less than 1 mm, this case is also to be understood as direct heat conduction in accordance with this application. However, this is at least partially unsatisfactory for coating at lower temperatures, like those that are required especially in the present case of diamond coating of at least largely finished microelectronic devices 33 and in this particular case of microelectronic devices 33 provided with traces 39 made of aluminum.

In order to improve this situation, substrate holder 1 has on its substrate side 3 a temperature control disk 4 traversed internally (flow channels 11) by a temperature control gas stream, on which disk substrate 2 is placed. A thermal insulating layer 20 can also be provided between temperature control disk 4 and substrate side 3.

Since temperature control disk 4 with ribs 21 abuts at least indirectly against substrate side 3, the heat between temperature control disk 4 and substrate side 3 of block 17 can be conducted through contact directly only in those areas. Between block 17 and cooling body 18, heat transfer takes place over the entire surface.

In addition, a rib-shaped design of temperature control disk 4 is also possible, with the temperature control gas, especially air, being conducted through the channels 22 that are formed between substrate side 3 and temperature control disk 4.

All the possibilities and their combinations have in common the fact that the entire removal of heat in substrate holder 1 is less than the heat loss in a full surface system. This is advantageous because in unfavorable cases the cooling action can be too great and the substrate temperature is then too low.

Although the specific thermal capacity of the temperature control gas is approximately only 25% of the specific heat capacity of water, a substrate 2 that is placed at least indirectly on temperature control disk 4 and hence on holder surface 5 of substrate holder 1 can be kept at temperatures below 400° C. and even below 300° C.

As a result, the microelectronic devices 33 are stressed only to a slight extent, especially negligibly, during diamond coating. The lower temperature during coating of microelectronic devices 33 with diamond significantly lowers the rejection rate. In addition, the temperature interval within which substrate 2 can be temperature controlled is increased.

A jet 23 is located opposite substrate 2 and is suitable for producing a gas jet for coating substrate 2 with diamond. Such jets 23 were originally developed for space flight, but in this application the dissociation of the carrier gas from hydrogen represents a high loss. On the other hand, the degree of dissociation of the carrier gas that is referred to as process or precursor gas for example in the epitaxis of diamond from the gas phase is significant.

Figure 5:
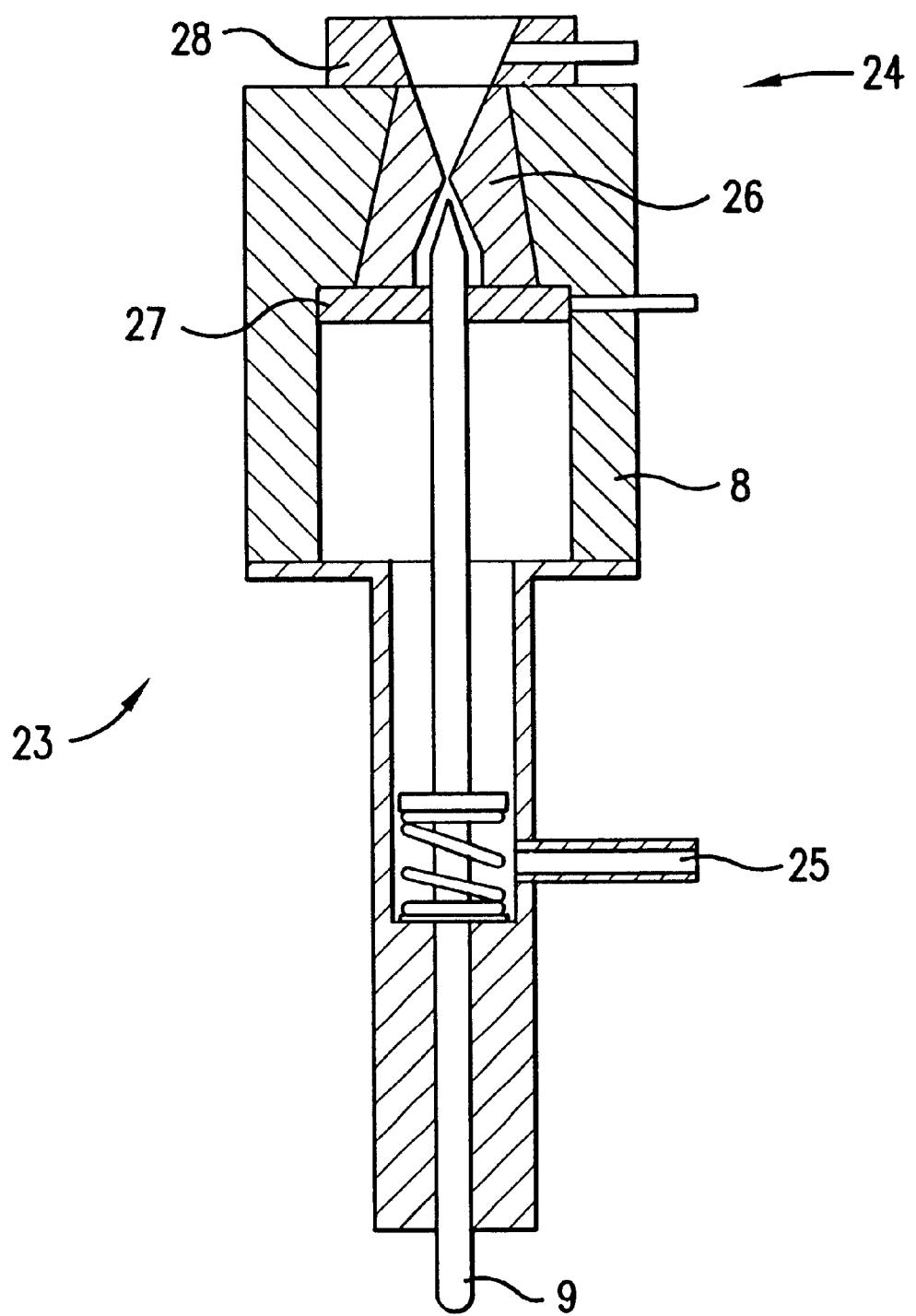
FIG. 5 is a detailed drawing of a nozzle for the CVD method by arcjet.

The design of jet 23 is shown in FIG. 5. Jet 23 has a cathode 9 that is located axially and centrally and is axially movable, the cathode having a melting point of 3410° C. and consisting of a tungsten alloy containing 2% thorium. Cathode 9 is made in the form of a jet needle and simultaneously functions as a sealing needle for jet opening 24.

Approximately in the middle of cathode 9, a gas inlet opening 25 is provided for one or more gases, especially hydrogen, that later form a plasma. An anode 8 is located at the outlet side area of jet 23. The actual jet opening 24 is formed by an insert, the so-called constrictor 26 which belongs to anode 8. In the vicinity of constrictor 26, the electrical discharge arc required for plasma formation is stabilized.

In the vicinity of the needle tip of cathode 9, in other words at the closure of jet opening 24, an injector disk 27 is provided, arranged concentrically with respect to cathode 9, for one or more gases of the plasma, while outside jet opening 24 an injector disk 28 for process gas ($CH_4$ and $O_2$) is located.

Anode 8 of the jet is made dome-shaped and arranged concentrically in the area of the jet opening around cathode 9. Anode 8 absorbs the electrode current and is exposed to strong thermal stresses. In order to reduce the stresses, the contact area of anode 8 is sharply enlarged, so that the pressure gradient in the expansion range increases. The high pressure gradient increases the free path length and the contact area of anode 8 is smeared.

Between the inlet and outlet of jet 24 the pressure drops from approximately 1 bar to approximately 0.3 mbar, in other words between 3 and 4 decades. The plasma gas formed is sharply depressurized, so that the plasma which is originally at a temperature of approximately 20,000 to 30,000 K is cooled to 5000 K. The static pressure at the jet outlet is greater than the pressure in the reactor. The jet speed reaches approximately one to three times the speed of sound as a result of the sharp expansion of the plasma.

In the following, the function of jet 23, in other words the arcjet, will be discussed briefly. An electrical field is built up in jet 23 between cathode 9 and anode 8. The electrons coming from cathode 9 are sharply accelerated. A portion of the kinetic energy of the electrons is delivered through impact processes to the gas that later forms the plasma, hereinafter referred to simply as hydrogen, with the hydrogen ionizing and dissociating. In the middle of the needle-shaped cathode 9 the hydrogen is introduced tangentially to cathode 9, with the hydrogen being given a twist. As a result of the convergent geometry of the gas chamber between anode 8 and the housing surrounding it, the hydrogen is accelerated and a short distance before constrictor 26 comes in contact with the discharge arc from the cathode tip. The relatively high pressure in the vicinity of constrictor 26 produces a high impact rate and hence a good thermal contact between the electrodes of the discharge arc and the hydrogen and to the formation of a plasma. Downstream from jet 23, the plasma beam expands so that its energy density decreases.

The process or precursor gas is introduced into the rapidly flowing plasma from the front, in other words the outflow side injector disk 28, with the energy of the gas being increased in the plasma and conducted away from the gas stream in the direction of substrate 2, where it is deposited in the form of diamond.

Figure 6:
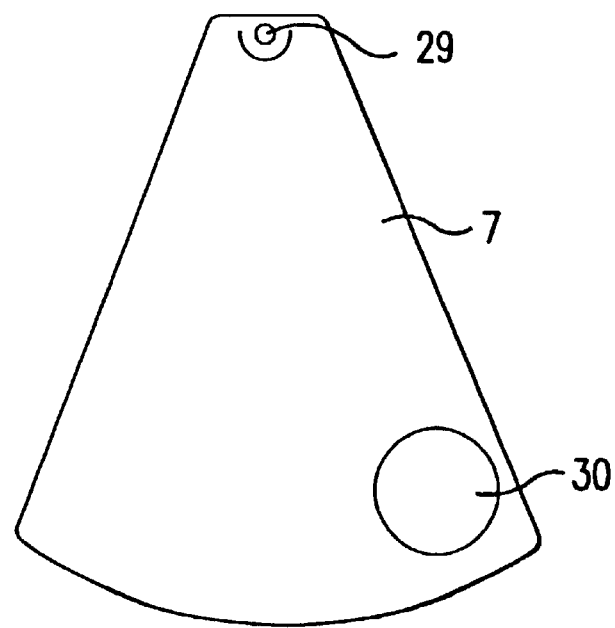
FIG. 6 is a detailed drawing of a cover.

Between jet 23 and substrate surface 6 to be coated, a cover 7 is provided, shown more exactly in FIG. 6. Plate-shaped cover 7 has an approximately triangular shape. Cover 7 is pivotably secured to a pivot axis 29 that is aligned parallel to the surface normal of substrate 2. At one marginal area, cover 7 has a preferably circular coating opening 30 which is adapted to the shape of the substrate. In the other area, which has the same distance from the pivot axis as the coating opening, the cover is made continuous up to the coating opening 30, with the diameter of coating opening 30 preferably being approximately the same as the diameter of substrate 2, more preferably slightly larger.

Cover 7 protects the seeded substrate surface 6 of substrate 2 from the ignition of the plasma and is not removed until the plasma and/or the gas stream that performs the coating action and is made of precursor material has stabilized once more. The covering time following ignition of the plasma is between 5 and 30 minutes and preferably between 10 and 20 minutes and more preferably about 15 minutes. Advantageously, cover 7 is cooled at least during the coverage of substrate 2. Cooling is advantageously performed using a liquid coolant, preferably water, that flows through channels located in the cover.

It is also advantageous, before igniting the plasma, to first allow an inert gas, preferably a noble gas, preferably argon (Ar), to flow as a gas between an anode and a cathode, to ignite the argon, and to produce an argon plasma. During a transitional phase, hydrogen is introduced into the Ar plasma, ignited, and used as a plasma material, with the argon being removed after the transitional phase.

In this procedure, the process gas used as the precursor material is introduced early with the $H_2$, especially as soon as possible after the transitional phase, and it is especially advisable at lower temperatures to add oxygen ($O_2$) together with the process gas used as the precursor material.

We will now describe the method for producing a composite structure according to the invention. First, the purified growth substrate 35, pretreated in the usual fashion, is placed in reactor 10, and reactor 10 is evacuated. After evacuation, with the aid of the growth substrate 35, several microelectronic devices are produced in terms of their layered structure using an epitactic method in known fashion. As mentioned above, growth substrate 35 and the functional layers 36, 37, and 38 of the device 33 located directly on it form substrate 2, which will be provided on its external substrate surface 6 with diamond layer 34.

Following the production of substrate 2, an immunization layer 41 is applied areawise to the substrate surface 6 away from growth substrate 35 or by means of a lithographic method, for example a photo-resist AZ 4533 with a layer of 1 to 5 μm is applied which is baked at approximately 80° C. In the area of the immunization layer, the seeding of substrate surface 6 is prevented or at least made more difficult. The concept of making more difficult in this context means that following seeding, the seed density in these areas is too low to form a closed diamond deposition.

Following the application of the immunization layer, the seeding of the remaining free substrate surface 6 proceeds. The substrate surface is preferably seeded mechanically and/or with the aid of ultrasound.

During ultrasonic seeding, the substrate is placed in a tank with a diamond-water suspension and irradiated with ultrasound. The substrate surface 6 is preferably provided in the area outside the immunization layer with the growth seeds.

In mechanical seeding, a sludge made of isopropanol and diamond powder is applied and the grains of the diamond powder are ground or polished into the substrate surface. Here again, substrate surface 6 is preferably provided outside the immunization layer with the growth seeds.

Following seeding, the immunization layer is removed and diamond layer 34, as described above, can be applied. In particular the immunization layer can be removed during or even before the deposition of diamond layer 34, for example by dissolution in acetone, ashing, in oxygen plasma, by plasma etching, or purely by heat.

Instead of the above procedure for seeding, other types of selective seeding are possible. Thus, it is particularly advantageous to apply a photo-resist at the spots where the diamond later will be located later, the photo-resist being mixed with growth seeds for the diamond layer. Hence, suppression of seeding does not take place but it is determined by the photo-resist.

In the following table, the experimental parameters are listed for various substrate materials and their results. All substrates are pretreated in comparable fashion. The substrates are purified and seeded in accordance with the disclosed methods; the seed density and the size of the growth seeds are comparable. The following terms are used in the table:

No.: Sample number;

Sub.: Material of substrate, with the microelectronic device being a MOSFET in SI/SiO$_2$ technology, which was fully functional before and after coating;

CH$_4$/H$_4$: Ratio of methane to hydrogen in percent (%);

O$_2$/CH$_4$: Ratio of oxygen to methane (%);

H$_2$ flow: Gas flow of hydrogen in [slm];

I$_D$: Current flow in jet between anode and cathode in amperes (A);

T$_S$: Substrate temperature during diamond deposition in (° C.);

P$_D$: Average power in arcjet in (kW);

t$_W$: Process duration in (min);

d$_S$: Average layer thickness of diamond layer in ($\mu$m);

v$_S$: Growth rate or speed in ($\mu$m/h); and Adhesion: Adhesion of diamond layer to the respective substrate.

| No. | A214 | A162 | A163 | A212 | A252 | A246 | A219 |
|---|---|---|---|---|---|---|---|
| Sub. | Si | Al | Al | Al | Al | micro-electronic device | WC—Co |
| CH$_4$/H$_4$ | 0.29 | 0.28 | 0.28 | 0.29 | 0.30 | 0.3 | 0.3 |
| O$_2$/CH$_4$ | 13 | 15 | 15 | 13 | 12 | 12 | 15 |
| H$_2$ flow | 15.6 | 14 | 14 | 15.6 | | 15.6 | 14 |
| I$_D$ | 20 | 15 | 15 | 20 | 22 | 22 | 15 |
| T$_S$ | 360 | 405 | 405 | 360 | 360 | 380 | 280 |
| P$_D$ | 2.48 | 1.78 | 1.78 | 2.4 | 2.8 | 2.75 | 1.8 |
| t$_W$ | 135 | 180 | 120 | 100 | 60 | 350 | 120 |
| d$_s$ | 1.3 | 2.1 | 1.5 | 1.8 | 0.5 | 0.8 | 1.6 |
| v$_s$ | 0.74 | 0.7 | .075 | 1.08 | 0.5 | 1.2 | 0.8 |
| adhesion | good | good | good | good | good | good | good |

As is clear from the table, high growth speeds and rates could be achieved on all substrates that are approximately a decade higher by comparison with the growth speeds and rates known at these temperatures.

All of the samples listed show good adhesion of the diamond layer to the substrate. The adhesion was determined with a so-called Scotch Tape Test (ST test). In this test, the diamond layer was covered by a strip of adhesive tape (brand name Tesa-Film). If the diamond layer does not come loose from the substrate when the adhesive tape is pulled off, the adhesion is considered sufficient.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A composite structure, comprising:
  a growth substrate;
  a plurality of microelectronic devices located in direct contact with the growth substrate; and
  a diamond layer located on a surface of the devices that faces away from the growth substrate,
    wherein the diamond layer comprises a plurality of separate diamond islands, each diamond island associated with a device in an area above said device,
      wherein each diamond island comprises diamond regions that are spatially separated from one another,
    wherein the diamond layer has thin spots between the devices at which a thickness of the diamond layer is a maximum of 90% of the diamond layer in a vicinity of the devices.

2. The composite structure according to claim 1, wherein the plurality of microelectronic devices are free of diamond in a vicinity of electrical contact points.

3. The composite structure according to claim 1, wherein the diamond layer comprises polycrystalline-diamond.

4. The composite structure according to claim 1, wherein the diamond layer projects beyond an edge of a device.

5. The composite structure according to claim 1, wherein the diamond layer has edges at which a layer thickness changes abruptly by at least 10% of the layer thickness of diamond layer.

6. The composite structure according to claim 5, wherein the diamond layer has edges at which a layer thickness changes a bruptly by at least 50% of the layer thickness of the diamond layer.

7. The composite structure according to claim 5, wherein the diamond layer has edges at which a layer thickness changes abruptly by at least 90% of the layer thickness of the diamond layer.

8. The composite material according to claim 1, wherein the diamond layer has thin spots between the devices at which a thickness of the diamond layer is a maximum of 50% of the diamond layer in a vicinity of the devices.

9. The composite material according to claim 1, wherein the diamond layer has thin spots between the devices at which a thickness of the diamond layer is a maximum of 10% of the diamond layer in a vicinity of the devices.

10. A composite structure according to claim 1, wherein said plurality of microelectronic devices further comprise an n-doped or p-doped semiconductor layer.

11. A composite structure according to claim 1, wherein said diamond layer is a chemical-vapor-deposited diamond layer.

12. A composite structure according to claim 1, wherein the plurality of diamond islands comprise epitaxial diamond.

13. A composite structure according to claim 1, wherein the thickness of the diamond layer between the devices is zero.

* * * * *